(12) United States Patent  (10) Patent No.: US 7,498,086 B2
Taniguchi  (45) Date of Patent: Mar. 3, 2009

(54) HEAT RESISTANT FILM AND METAL LAMINATE THEREOF

(75) Inventor: Kouichirou Taniguchi, Nagahama (JP)

(73) Assignee: Mitsubishi Platics, Inc., Tokyo (JP)

( * ) Notice: Subject to any disclaimer, the term of this patent is extended or adjusted under 35 U.S.C. 154(b) by 502 days.

(21) Appl. No.: 10/523,633

(22) PCT Filed: Aug. 7, 2002

(86) PCT No.: PCT/JP02/08080

§ 371 (c)(1),
(2), (4) Date: Feb. 4, 2005

(87) PCT Pub. No.: WO2004/015011

PCT Pub. Date: Feb. 19, 2004

(65) Prior Publication Data

US 2006/0035093 A1    Feb. 16, 2006

(51) Int. Cl.
B32B 15/08    (2006.01)
B32B 27/00    (2006.01)
(52) U.S. Cl. .................. 428/458; 428/457; 428/473.5
(58) Field of Classification Search .......... None
See application file for complete search history.

(56) References Cited

U.S. PATENT DOCUMENTS 7,033,675 B2 *   4/2006   Taniguchi et al. ........... 428/458

FOREIGN PATENT DOCUMENTS

| JP | A 2000-277875 | 10/2000 |
| JP | A 2002-52648 | 2/2002 |
| JP | A 2002-105221 | 4/2002 |
| JP | A 2002-144436 | 5/2002 |
| JP | A 2002-226699 | 8/2002 |
| WO | WO 02/57343 A1 | 7/2002 |

* cited by examiner

Primary Examiner—Monique R Jackson
(74) Attorney, Agent, or Firm—Oliff & Berridge, PLC

(57) ABSTRACT

A heat resistant film comprising total 100 parts by weight of a resin composition comprising at least (A-1) a polyetherimide resin having repeating units of the structural formula (1), (A-2) a polyetherimide resin having repeating units of the structural formula (2), and (B) a polyarylketone resin having a melting peak temperature of 260 degrees C. or higher, and 5 to 50 parts by weight of a filler, wherein a weight ratio of the resin components, [(A-1)+(A-2)]/(B)], ranges from 70/30 to 30/70 and a weight ratio, (A-1)/(A-2), ranges from 70/30 to 30/70.

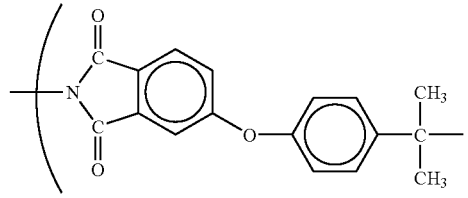

(1)

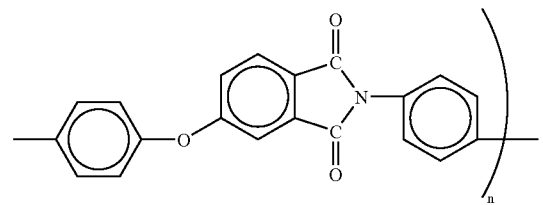

(2)

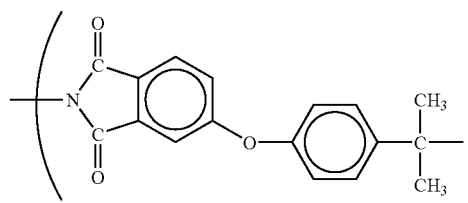

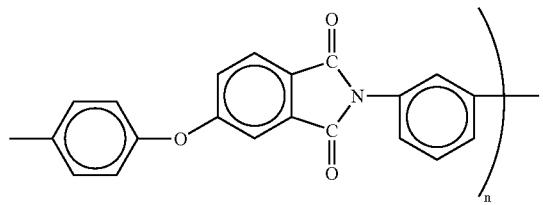

8 Claims, No Drawings

HEAT RESISTANT FILM AND METAL LAMINATE THEREOF

FIELD OF THE INVENTION

This invention relates to a material used in the electronics industry, particularly to a heat resistant film suitably used for copper laminated boards. Specifically, the present invention relates to a heat resistant film and a metal laminate thereof which film has good heat bonding property at a low temperature of 260 degrees C. or lower and good balance between edge tearing resistance and soldering heat resistance after a pressure cooker test.

DESCRIPTION OF THE PRIOR ART

A crystalline polyarylketone resin, typically polyetheretherketone, is excellent in heat resistance, flame retardant property, hydrolysis resistance, and chemical resistance and, therefore, widely used mainly for aircraft parts, electric parts and electronic parts. However, raw materials for the polyarylketone resin are very expensive. Further, a glass transition temperature of the resin is so relatively low as about 140 degrees C. to 170 degrees C. For this reason, various attempts have been made to further improve heat resistance of the resin, among which a blend of the resin with a noncrystalline polyetherimide resin has attracted attentions.

The present inventor proposed a printed wiring board comprising the aforesaid blend and a production method thereof in Japanese Patent Application Laid-Open No. 2000-38464 and Japanese Patent Application Laid-Open No. 2000-200950.

A film comprising a composition comprising a mixture of the crystalline polyarylketone resin and the noncrystalline polyetherimide resin described in aforesaid publications, which composition usually contains an inorganic filler to improve dimensional stability, has a controlled crystallinity and a good heat bonding property at a low temperature of 260 degrees C. or lower. A flexible printed wiring board made of the film has good dimensional stability and heat resistance.

However, mechanical strength, especially edge tearing resistance, of the film is not satisfactory, and folding resistance and bending resistance are not enough to secure reliable electrical connection in the wiring board. Further, improvement is required on handling property in a processing step of the wiring board.

SUMMARY OF THE INVENTION

Therefore, an object of the present invention is to provide a heat resistant film and a metal laminate thereof suitable as electronic materials, which film has good heat bonding property and good balance between edge tearing resistance and soldering heat resistance after a pressure cooker test.

The present inventor has found that the above object can be attained by a heat resistance film composed mainly of a resin composition comprising a crystalline polyarylketone resin and two specific noncrystalline polyetherimide resins.

Thus, the present invention is a film comprising (A-1) a polyetherimide resin having repeating units of the following structural formula (1), (A-2) a polyetherimide resin having repeating units of the structural formula (2), (B) a polyarylketone resin having a melting peak temperature of 260 degrees C. or higher, and a filler in an amount of from 5 to 50 parts by weight, based on total 100 parts by weight of (A-1), (A-2) and (B), wherein a weight ratio of the resin components, [(A-1)+(A-2)]/(B)], ranges from 70/30 to 30/70 and a weight ratio, (A-1)/(A-2), ranges from 70/30 to 30/70.

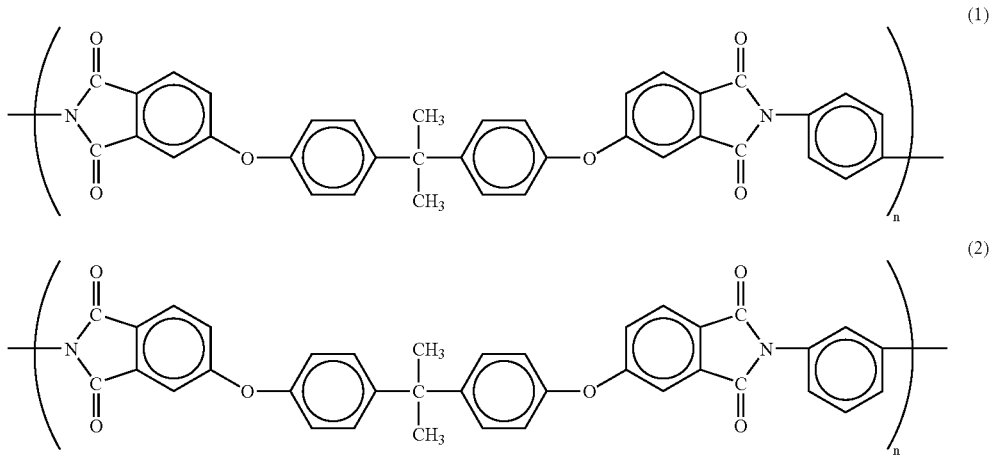

The weight ratio, [(A-1)+(A-2)]/(B), preferably ranges from 65/35 to 35/65, more preferably from 65/35 to 45/55, and the weight ratio, (A-1)/(A-2), preferably ranges from 65/35 to 35/65, more preferably from 65/35 to 50/50.

The amount of the filler preferably ranges from 10 to 45 parts by weight, more preferably from 20 to 40 parts by weight.

Another aspect of the present invention is a metal laminate comprising the above film and a metal body laminated on at least one side of said film. Preferably, the metal body comprises copper, aluminum, or stainless steel.

Still another aspect of the present invention is a multilayered board comprising at least two copper laminated films, each comprising the above film and a copper foil laminated on one side of said film.

Further, the present invention is a resin composition to prepare the above film.

DESCRIPTION OF THE PREFERRED EMBODIMENTS

The present film comprises (A-1) a polyetherimide resin having repeating units of the structural formula (1), (A-2) a polyetherimide resin having repeating units of the structural formula (2), (B) a polyarylketone resin having a melting peak temperature of 260 degrees C. or higher, and a filler in an amount of from 5 to 50 parts by weight, based on total 100 parts by weight of (A-1), (A-2) and (B), wherein a weight ratio of the resin components, [(A-1)+(A-2)]/(B)], ranges from 70/30 to 30/70 and a weight ratio, (A-1)/(A-2), ranges from 70/30 to 30/70. The term, "film", as used herein also includes a sheet having a relatively large thickness of about 500 μm or larger.

The noncrystalline polyetherimide resin is a thermoplastic resin having structural units which comprises aromatic nucleus bonds, ether bonds, and imide bonds. Specifically, the noncrystalline polyetherimide resins are those having the following repeating units (1) and (2), which are available under a trade name, "Ultem CRS5001" and "Ultem1000", respectively, from General Electric Co.

The noncrystalline polyetherimide resin may be produced in any known method. Usually, the noncrystalline polyetherimide resin of the aforesaid formula (1) is a polycondensation product of 4,4'-[isopropylidene bis (p-phenyleneoxy)diphthalic dianhydride with p-phenylenediamine produced by a known method; and the noncrystalline polyetherimide resin of the formula (2) is a polycondensation product of 4,4'-[isopropylidene bis(p-phenyleneoxy)diphthalic dianhydride with m-phenylenediamine produced by a known method. The aforesaid noncrystalline polyetherimide resins may include other copolymerizable monomeric units in an amount which does not adversely affect the present invention.

The crystalline polyarylketone resin used in the present invention is a thermoplastic resin having structural units which comprises aromatic nucleus bonds, ether bonds, and ketone bonds. Typical examples of the polyarylketone resin are polyether ketone, polyetheretherketone, and polyetherketoneketone, among which the polyetheretherketone of the following repeating unit (3) is preferably used in the present invention. The polyetheretherketone having the repeating unit is available under trade names, "PEEK151G", "PEEK381G", and "PEEK450G", from VICTREX Co. The crystalline polyarylketone resin can be used alone or in combination of two or more of them.

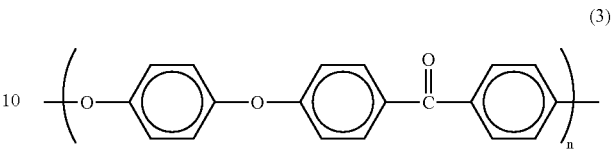

(3)

A blending ratio in weight of the aforesaid noncrystalline polyetherimide resins to the crystalline polyarylketone resin ranges from 70/30 to 30/70, preferably from 65/35 to 35/65, more preferably from 65/35 to 45/55. A composition having a weight ratio higher than the aforesaid upper limit is undesirable because crystallinity of such a composition as a whole is too low and crystallizes too slowly to attain satisfactory soldering heat resistance, even though it contains the polyarylketone resin having a melting peak temperature of 260 degrees C. or higher. On the other hand, a composition having a weight ratio smaller than the aforesaid lower limit is undesirable, too, because a glass transition temperature of such a

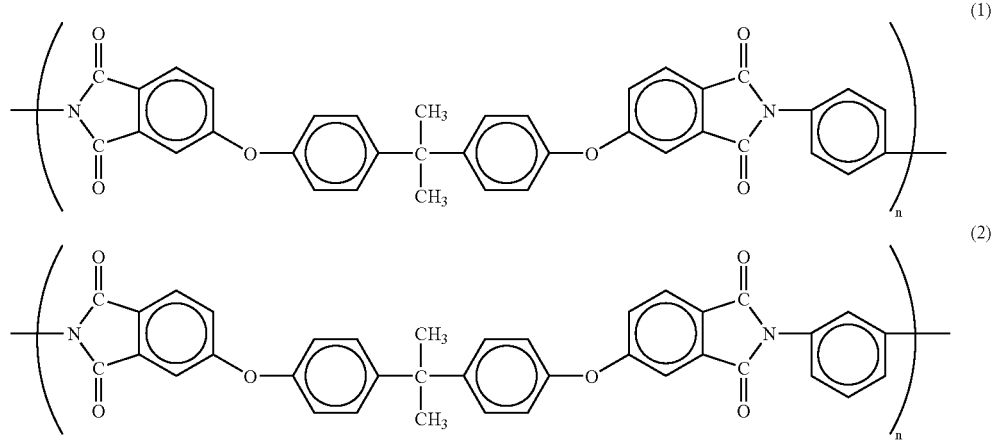

(1)

(2)

composition is too low to have sufficient dimensional stability and a circuit board made of the composition tends to shrink a lot due to crystallization and, therefore, is less reliable.

A blending ratio in weight of (A-1) the noncrystalline polyetherimide resin to (A-2) the noncrystalline polyetherimide resin ranges from 70/30 to 30/70, preferably from 65/35 to 35/65, more preferably from 65/35 to 50/50. A composition having a weight ratio higher than the aforesaid upper limit is undesirable because a multilayered board made by heat bonding such a composition tends to show blistering of the resin at an interface between two layers in a pressure cooker test, herein after referred to as PCT. On the other hand, a composition having a weight ratio smaller than the aforesaid lower limit is undesirable, too, because edge tearing resistance of such a composition is too small.

As the filler used in the present invention, any known filler can be used, for example, inorganic filler such as talc, mica, clay, glass, aluminum, silica, aluminum nitride, and silicon nitride, and fiber such as glass fiber and aramid fiber. These may be used alone or in combination of two or more of them.

The filler may be surface treated with a coupling agent such as titanate, fatty acids, resin acids, or various kinds of surfactants. Particularly when the present film is used for a printed wiring board, inorganic filler having an average particle size of from 1 to 20 μm and an average aspect ratio, i.e., a ratio of a particle diameter to a thickness, of about 20 to about 30 or larger, particularly 50 or larger, is preferably used.

The filler is incorporated in an amount of from 5 to 50 parts by weight, preferably from 10 to 45 parts by weight, more preferably from 20 to 40 parts by weight, per 100 parts by weight of the aforesaid resin composition. If the filler is incorporated in an amount larger than the aforesaid upper limit, flexibility and edge tearing resistance of a film may be undesirably lower. If the filler is incorporated in an amount less than the aforesaid lower limit, improvement in dimension stability attained by decrease in a coefficient of linear expansion is undesirably smaller.

When the present film is used as a base material for an electronic board such as a flexible printed wiring board, the film preferably has a coefficient of linear expansion of $30 \times 10^{-6}$/degrees C. or smaller and an edge tearing resistance of at least 40 MPa, more preferably at least 50 MPa, in both longitudinal and transversal directions. If the coefficient of linear expansion is larger than $30 \times 10^{-6}$/degrees C., a laminate of a film with a metal foil tends to curl or warp or to have insufficient dimension stability. A preferred range of the coefficient of linear expansion depends on a type of the metal foil used, a circuit pattern formed on the front and the back sides of the laminate, and the laminate structure, but is generally from $10 \times 10^{-6}$/degrees C. to $25 \times 10^{-6}$/degrees C. If the edge tearing resistance is smaller than 40 MPa, reliability of circuit connection is insufficient in a thin board such as a flexible printed wiring board, or a handling property during processing of the board tends to be bad. A measurement of the edge tearing resistance will be described herein later.

These properties are obtained by subjecting the film to crystallization treatment. A method and a period of time for the crystallization treatment are not particularly limited, but may be, for example, a cast crystallization method where a film is crystallized when cast-extruded; an in-line crystallization method where crystallization is effected in a film molding line, e.g., on a heat treatment roll or in a hot wind furnace; and an out-line crystallization method where crystallization is effected off a film molding line, e.g., in a thermostatted oven or by a hot press. In the present invention, the out-line crystallization method is preferably used in view of stability of production and uniformity of the properties. A time period of the crystallization treatment may such that the aforesaid equation is satisfied, and may be in a range of from a few seconds to a few tens hours, preferably from a few minutes to about 3 hours.

In the present invention, any known method can be used for laminating the present film on a metal body such as a copper foil. Preferably, the metal body is heat bonded to at least one side of the aforesaid film by pressing them under heating without an adhesive layer therebetween.

Any known method can be used to heat bonding a metal body on a film without an adhesive layer therebetween, for example, a method of pressing a film and a metal body in a press heated to a desired heat bonding temperature, a method of heating a metal body to a heat bonding temperature and pressing it onto a film, a continuous method of pressing a film and a metal body against each other on a hot rolls heated to a heat bonding temperature, and a combination thereof. When a press is used, it is preferred to employ a pressure per area of from 0.98 to 9.8 MPa, i.e., 10 to 100 kg/cm², in an atmosphere of a reduced pressure of about 973 hPa so as to avoid oxidation of the metal. The lamination may be made on one side of the film and the metal, or on both sides of the film and/or the metal.

Any known method such as etching may be used to form a conductive circuit on the metal body of the present metal laminate for an electronic board such as a flexible printed wiring board, rigid-flexible board, built-up multilayer board, bundled multilayer board, and metallic base board. Any method can be used to form interlayer connection in a multilayer board, for instance, by plating through-holes with copper, filling through-holes or inner via holes with a conductive paste or solder balls, or utilizing an anisotropically conductive material comprising fine conductive particles in an insulating layer.

The metal body to be used in the present invention may comprise copper, silver, gold, iron, zinc, aluminum, magnesium, nickel, or alloys thereof. These may be used alone or in a mixture of two or more of them. The metal may be surface treated with a surface treatment agent such as aminosilane, as far as the purpose of the present invention is not disturbed.

The metal body may be in a form of a structural element, a strip to form electric or electronic circuit, or a foil having a thickness of from about 3 μm to about 70 μm to form a circuit thereon by etching. An aluminum plate or foil is preferred mostly for heat dissipation; a stainless steel plate or foil is preferred for an application where high corrosion resistance, mechanical strength, or electric resistance is required; a copper foil is preferred for forming a complicated and fine circuit. Particularly one which is chemically treated, e.g., by black oxidation treatment, is preferred. To increase bonding strength, a surface of the metal body to be bonded to a molded article of the mixed resin is preferably roughened chemically or mechanically before bonded. An example of such a roughened conductive film is a roughened copper foil which has been electrochemically treated in the production of electrolytic copper foils.

The composition constituting the present film may comprise other resins or various additives in addition to the inorganic fillers, such as heat stabilizers, UV absorbers, photostabilizers, nucleating agents, colorants, lubricants, and flame retardants, in such an amount that they do not adversely affect the properties of the composition.

To mix the filler and various additives, any known method can be used. For example, (a) a master batch is prepared by incorporating the additive at a high concentration, typically, of from 10 to 60 wt % in an appropriate base resin such as the polyarylketone resin and/or the noncrystalline polyetherimide resin, and added to the resins to be used to attain a desired concentration of the additive and then mechanically blended with a kneader or an extruder, or (b) the additive is mechanically blended directly with the resins to be used in a kneader or an extruder. Among the aforesaid mixing methods, the method (a) by preparing and blending a master batch is preferred because higher dispersion and easier handling of the additive is attained. To improve a handling property of the film, a surface of the film may be subjected to embossing or corona treatment.

The present film may be formed by any known method such as an extrusion casting method using a T-die and a calendar method. Preferably, the extrusion casting method with a T-die is used, but not limited to it, because it allows one to make a film with ease and stable productivity. In the extrusion casting method using a T-die, a molding temperature depends on a flow property and film moldability of the composition but is generally in a range of from about a melting temperature of the composition to about 430 degrees C. The film usually has a thickness of from about 10 to about 800 μm, but not limited to this.

EXAMPLES

The present invention will be explained with reference to the following Examples, but not limited to them. Measurements and evaluation on the films described in the Examples were carried out as follows, wherein a longitudinal direction means a machine direction of an extruder and a transversal direction means a direction normal to the machine direction.

(1) Glass Transition Temperature (Tg) and Melting Peak Temperature (Tm)

These temperatures were determined from a thermogram obtained by heating 10 mg of a sample at a heating rate of 10 degrees C./minute according to the Japanese Industrial Standards, JIS-K7121, using DSC-7, ex Perkin-Elmer Inc.

(2) Edge Tearing Resistance

According to the edge tearing resistance test specified in JIS C2151, a test specimen of 15 mm width by 300 mm length was cut out from a 75 μm-thick film crystallized at a temperature of 250 degrees C. and at a pressure of 2.94 MPa for 30 minutes, which conditions were the same as those of vacuum pressing to make a multilayered board. The test specimen was tested both in its longitudinal and transversal directions at a drawing speed of 500 mm/min using a test fixture B.

(3) Bonding Strength

The bonding strength was determined according to the method for measuring a peeling strength of a film in its original state, as specified in JIS C6481.

(4) Soldering Heat Resistance

In accordance with JIS C6481 for the soldering heat resistance test, a multilayered board was floated on solder in a bath at 260 degrees C. for 20 seconds in such a manner that a copper foil side of the laminate was in contact with the solder. After cooled to room temperature, the board was visually observed and evaluated for the presence of blistering and/or peeling.

(5) Soldering Heat Resistance After Pressure Cooker Test

Using a pressure cooker tester, a multilayered board prepared was treated at a temperature of 121 degrees C., a relative humidity of 100% RH and a pressure of 202650 Pa, i.e., 2 atm. After 4-hour treatment, the multilayered board was taken out from the pressure cooker tester. Then, the multilayered board was floated on solder in a bath at 260 degrees C. for 20 seconds in such a manner that a copper foil side of the laminate was in contact with the solder, cooled to room temperature, and the board was visually observed and evaluated for the presence of blistering and/or peeling, according to JIS C6481.

Example 1

As shown in Table 1, a composition consisting of 30 parts by weight of (A-1) a polyetherimide resin (Ultem-CRS5001, ex General Electric Co., having a Tg of 226 degrees C., hereinafter referred to as PEI-1), 20 parts by weight of (A-2) a polyetherimide resin (Ultem-1000, ex General Electric Co., having a Tg of 216 degrees C., hereinafter referred to as PEI-2) 50 parts by weight of (B) a polyetheretherketone resin (PEEK381G, ex Victrex Co., having a Tg of 143 degrees C. and Tm of 334 degrees C., hereinafter referred to as PEEK), and 25 parts by weight of a commercially available mica (having an average particle size of 10 μm and an average aspect ratio of 50) was extruded into a film of 75 μm thickness at 380 degrees C. in an extruder provided with a T-die, and extrusion-laminated to a copper foil (18 μm thickness, surface roughened) to obtain a single side copper laminated film. For an evaluation purpose, a film of 75 μm thickness with no lamination was also prepared. From the single-side copper laminated film, test specimens having an A4 size, i.e., 21 cm×29.7 cm, were cut out. On each specimen, a predetermined circuit pattern was formed by etching and through-holes were made which was filled with a conductive paste. Three test specimens of single-side copper laminated film with their through-holes filled with a conductive paste were stacked in the layered structure of copper foil/resin film/copper foil/resin film/copper foil/resin film/copper foil and vacuum pressed at a temperature of 250 degrees C. and a pressure of 2.94 MPa for 30 minutes to prepare a multilayered board. The evaluation results on the multilayered board are as seen in Table 1.

Comparative Example 1

A multilayered board was prepared in the same manner as in Example 1, except that a resin composition comprising PEI-1 and PEEK in a PEI-1/PEEK weight ratio of 50/50 was used instead of the resin composition used in Example 1. The evaluation results on the multilayered board are as seen in Table 1.

Comparative Example 2

A multilayered board was prepared in the same manner as in Example 1, except that a resin composition comprising PEI-1, PEI-2 and PEEK in a PEI-1/PEI-2/PEEK weight ratio of 10/40/50 was used instead of the resin composition used in Example 1. The evaluation results on the multilayered board are as seen in Table 1.

Comparative Example 3

A multilayered board was prepared in the same manner as in Example 1, except that a resin composition comprising PEI-2 and PEEK in a PEI-2/PEEK weight ratio of 50/50 was used instead of the resin composition used in Example 1. The evaluation results on the multilayered board are as seen in Table 1.

TABLE 1

| | Example | Comparative Example | | |
|---|---|---|---|---|
| | 1 | 1 | 2 | 3 |
| PEI-1, part by weight | 30 | 50 | 10 | |
| PEI-2, part by weight | 20 | | 40 | 50 |
| PEEK, part by weight | 50 | 50 | 50 | 50 |
| Mica, part by weight | 25 | 25 | 25 | 25 |
| Edge tearing resistance (MPa) longitudinal | 158.8 | 176.3 | 136.2 | 129.7 |
| Edge tearing resistance (MPa) transversal | 82.9 | 88.1 | 38.2 | 35.5 |
| Press temperature (° C.) | 250 | 250 | 250 | 250 |
| Bonding strength (N/mm) | 1.5 | 1.4 | 1.6 | 1.6 |
| Soldering heat resistance | Good | Good | Good | Good |
| Soldering heat resistance after pressure cooker test | Good | Not Good, Blistering observed | Good | Good |

It can be seen from Table 1 that the film of Example 1 comprising the polyarylketone resin and the two polyetherimide resins in a blending weight ratio specified in the present invention has both good edge tearing resistance and good soldering heat resistance after the pressure cooker test on the film heat bonded at a low temperature.

On the other hand, the films comprising only either one of the polyetherimide resins has a worse soldering heat resistance after the pressure cooker test on the film heat bonded at a low temperature as in Comparative Example 1 or a worse edge tearing resistance as in Comparative Example 3. The film of Comparative Example 2 comprising the polyarylketone resin and the two polyetherimide resins specified in the present invention, but in a blending weight ratio outside the specified range does not have good balance between the edge tearing resistance and the heat resistance after the presser cooker test.

INDUSTRIAL APPLICABILITY

The present invention provides a heat resistant film and a metal laminate thereof, which film has an excellent heat bonding property at a temperature not higher than 260 degrees C. and a good balance between heat resistance after pressure cooker test and edge tearing resistance. The film and the metal laminated are suitable as a material for electronic parts.

The invention claimed is:

1. A film comprising (A-i) a polyetherimide resin having repeating units of the following structural formula (1), (A-2) a polyetherimide resin having repeating units of the structural formula (2), (B) a polyarylketone resin having a melting peak temperature of 260 degrees C. or higher, and a filler in an amount of from 5 to 50 parts by weight, based on total 100 parts by weight of (A-1), (A-2) and (B), wherein a weight ratio of the resin components, [(A-1)+(A-2)]/(B)], ranges from 65/35 to 45/55 and a weight ratio, (A-1)/(A-2), ranges from 70/30 to 50/50;

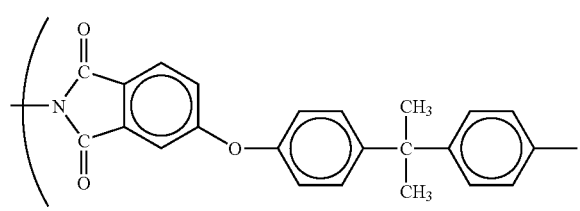

(1)

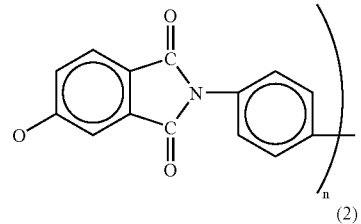

(2)

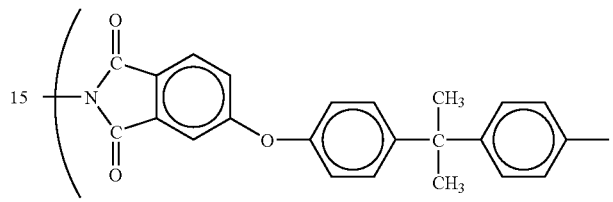

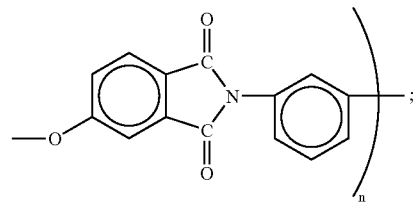

wherein, the film has a heat bonding property at a temperature of 260 degrees C. or lower and an edge tearing resistance of at least 50 MPa in both a longitudinal direction and a transversal direction.

2. The film according to claim 1, wherein the weight ratio of the resin components, (A-1)/(A-2), ranges from 65/35 to 50/50.

3. The film according to claim 1, wherein the amount of the filler ranges from 20 to 40 parts by weight, based on total 100 parts by weight of (A-1), (A-2), and the weight ratio, (A-1)/(A-2), ranges from 65/35 to 50/50.

4. A metal laminate comprising the film according to claim 3 and a metal body laminated on at least one side of said film.

5. A multilayered board comprising at least two copper laminated films, each comprising the film according to claim 3 and a copper foil laminated on one side of said film.

6. A metal laminate comprising the film according to claim 1 and a metal body laminated on at least one side of said film.

7. The metal laminate according to claim 6, wherein the metal body comprises copper, aluminum, or stainless steel.

8. A multilayered board comprising at least two copper laminated films, each comprising the film according to claim 1 and a copper foil laminated on one side of said film.

* * * * *